(12) United States Patent
Kuo et al.

(10) Patent No.: US 8,035,097 B2
(45) Date of Patent: Oct. 11, 2011

(54) PHASE CHANGE MEMORY

(75) Inventors: Chien-Li Kuo, Hsinchu (TW); Yung-Chang Lin, Taichung County (TW); Kuei-Sheng Wu, Tainan County (TW); Chien-Hsien Chen, Taipei (TW)

(73) Assignee: United Microelectronics Corp., Hsinchu (TW)

( * ) Notice: Subject to any disclaimer, the term of this patent is extended or adjusted under 35 U.S.C. 154(b) by 196 days.

(21) Appl. No.: 12/325,801

(22) Filed: Dec. 1, 2008

(65) Prior Publication Data

US 2010/0133503 A1 Jun. 3, 2010

(51) Int. Cl.
*H01L 29/06* (2006.01)
*H01L 47/00* (2006.01)
(52) U.S. Cl. ............. 257/5; 257/2; 257/4; 257/E45.002; 257/E47.001
(58) Field of Classification Search .................. 257/2, 4, 257/5, E45.002, E47.001, E21.001, 613–616; 365/148, 151
See application file for complete search history.

(56) References Cited

U.S. PATENT DOCUMENTS

| | | | |
|---|---|---|---|
| 5,998,244 A | * | 12/1999 | Wolstenholme et al. ...... 438/128 |
| 6,339,544 B1 | * | 1/2002 | Chiang et al. .................. 365/163 |
| 2006/0186483 A1 | * | 8/2006 | Cho et al. ....................... 257/390 |
| 2006/0237756 A1 | | 10/2006 | Park et al. |

* cited by examiner

*Primary Examiner* — Lynne Gurley
*Assistant Examiner* — Naima Kearney
(74) *Attorney, Agent, or Firm* — WPAT, PC; Justin King

(57) ABSTRACT

A phase change memory is provided, which includes a semiconductor substrate having a first conductive type, buried word lines having a second conductive type, doped semiconductor layers having the first conductive type, memory cells, metal silicide layers, and bit lines. The buried word lines are disposed in the semiconductor substrate. Each buried word line includes a line-shaped main portion extended along a first direction and protrusion portions. Each protrusion portion is connected to one long side of the line-shaped main portion. Each doped semiconductor layer is disposed on one protrusion portion. Each memory cell includes a phase change material layer and is disposed on and electrically connected to one of the doped semiconductor layers. Each metal silicide layer is disposed on one of the line-shaped main portions. Each bit line is connected to memory cells disposed on the word lines in a second direction substantially perpendicular to the first direction.

20 Claims, 5 Drawing Sheets

PHASE CHANGE MEMORY

BACKGROUND OF THE INVENTION

1. Field of the Invention

The present invention generally relates to a memory, in particular, to a phase change memory.

2. Description of Related Art

With the continuous progressing and evolution of the semiconductor technology, the manufacturing process of memory devices also strides forward towards physical limits. Thanks to the advantages of small volume, low power consumption, high read/write speed, high capacity density, and the like, a phase change memory (PCM) is considered as one of nonvolatile memory devices that are developed with great efforts currently.

Generally speaking, the PCM takes a chalcogenide (Ge—Sb—Te) as storage media. The chalcogenide changes between two phases of amorphous and crystalline phases under different annealing temperature conditions, and the two phases have different resistances. Therefore, the high-resistance amorphous phase and the low-resistance crystalline phase may be used for the memory to store digital data of "0" and "1". Particularly, the two phases of the chalcogenide is reversible, so that the PCM can be repeatedly used for performing the operations such as programming, reading, and erasing.

In a conventional diode type PCM, a plurality of memory cells is disposed on a buried word line, and metal silicide layer is formed on the buried word line between memory cells. In other words, the metal silicide layer disposed on the word line is discontinuous. Therefore, when a current flows from a memory cell to a signal contact, a transmission path thereof not only includes the metal silicide layer, but also includes a substrate below the plurality of memory cells where the current flows. The resistance of the metal silicide layer is much smaller than that of the substrate, thus an impedance difference of the transmission paths between each of the memory cells on the same word line and the signal contact is rather large, which results in a large current difference and a large voltage difference between the memory cells when the data is read from or written into the memory cells on the same word line. And, the large current difference and the large voltage difference between the memory cells result in data misjudgment when a data is written in each of the memory cells or data reading error when a data is read from each of the memory cells.

SUMMARY OF THE INVENTION

Accordingly, the present invention is directed to a phase change memory (PCM), suitable for reducing a current difference and a voltage difference between memory cells on the same word line when a data is read from or written into the memory cells.

As embodied and broadly described herein, the present invention provides a PCM, which includes a semiconductor substrate, a plurality of buried word lines, a plurality of doped semiconductor layers, a plurality of memory cells, a plurality of first metal silicide layers, and a plurality of bit lines. The semiconductor substrate has a first conductive type. The plurality of buried word lines has a second conductive type and is disposed in the semiconductor substrate. Each of the buried word lines includes a line-shaped main portion and a plurality of protrusion portions. The line-shaped main portion is extended along a first direction. Each of the protrusion portions is connected to one long side of the line-shaped main portion. Each of the doped semiconductor layers has the first conductive type and is disposed on one of the protrusion portions. Each of the memory cells includes a phase change material layer, and the memory cell is disposed on and electrically connected to one of the doped semiconductor layers. Each of the first metal silicide layers is disposed on one of the line-shaped main portions. Each of the bit lines is connected to memory cells disposed on the buried word lines in a second direction substantially perpendicular to the first direction.

In an embodiment of the present invention, the protrusion portions are located at the same long side of the line-shaped main portion.

In an embodiment of the present invention, the protrusion portions include a plurality of first protrusion portions and a plurality of second protrusion portions. The first protrusion portions are located at one long side of the line-shaped main portion, and the second protrusion portions are located at the other long side of the line-shaped main portion.

In an embodiment of the present invention, the first conductive type is an N type, and the second conductive type is a P type.

In an embodiment of the present invention, the first conductive type is a P type, and the second conductive type is an N type.

In an embodiment of the present invention, the phase change material layer includes chalcogenide.

In an embodiment of the present invention, the PCM further includes spacers, and each of the spacers is disposed on a side wall of one of the doped semiconductor layers.

In an embodiment of the present invention, the spacers include silicon oxide or silicon nitride.

In an embodiment of the present invention, the PCM further includes second metal silicide layers, and each of the second metal silicide layers is disposed between the doped semiconductor layer and the memory cell.

In an embodiment of the present invention, each of the memory cells further includes a first electrode disposed between the doped semiconductor layer and the phase change material layer.

In an embodiment of the present invention, the first electrode includes metal or metal nitride.

In an embodiment of the present invention, each of the memory cells further includes a second electrode disposed between the phase change material layer and the bit line.

In an embodiment of the present invention, the second electrode includes metal or metal nitride.

In an embodiment of the present invention, the doped semiconductor layer includes doped polysilicon, doped single crystal silicon or doped epitaxial silicon.

In the PCM according to the present invention, the buried word line includes the line-shaped main portion and the plurality of protrusion portions connected to the line-shaped main portion, the memory cells are disposed on the protrusion portions, and the metal silicide layer is disposed on the line-shaped main portion. That is to say, the continuous metal silicide layer is connected to each of the memory cells on the same word line. In this way, a voltage difference between the memory cells on the same word line is reduced.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
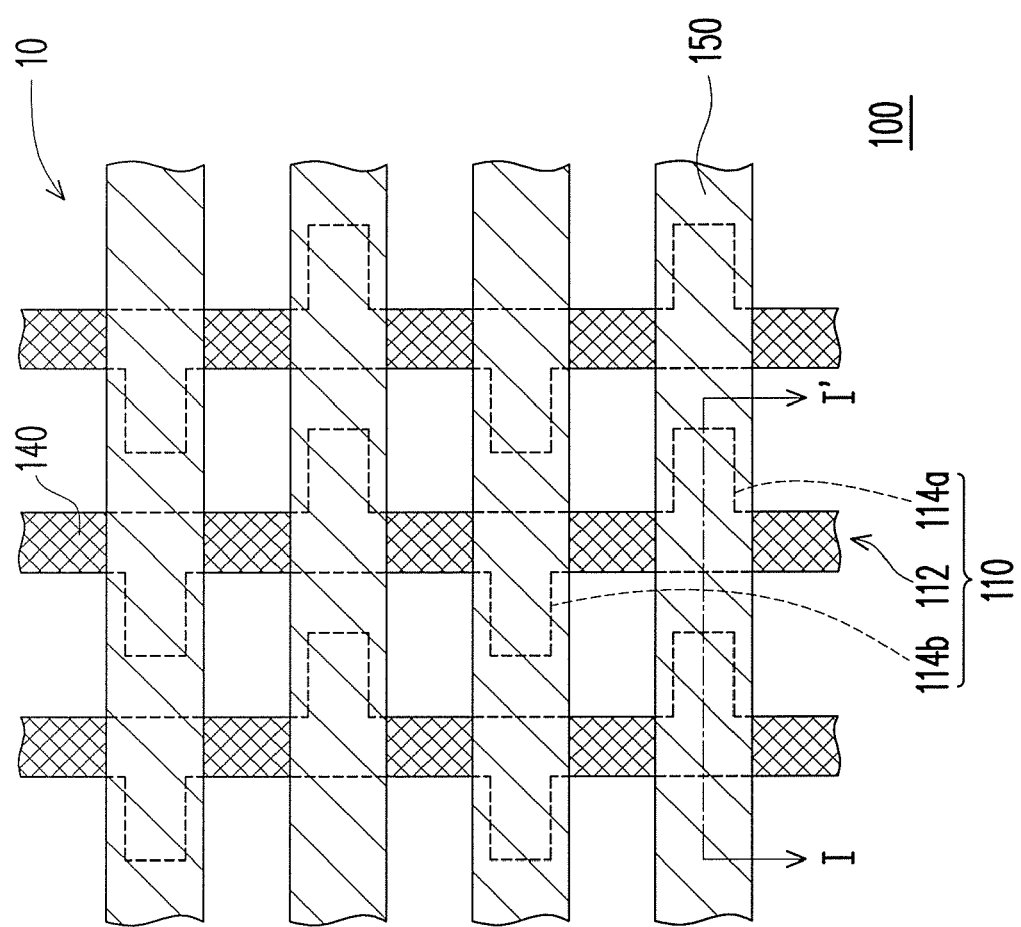
FIG. 1A is a schematic top view of a phase change memory (PCM) according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
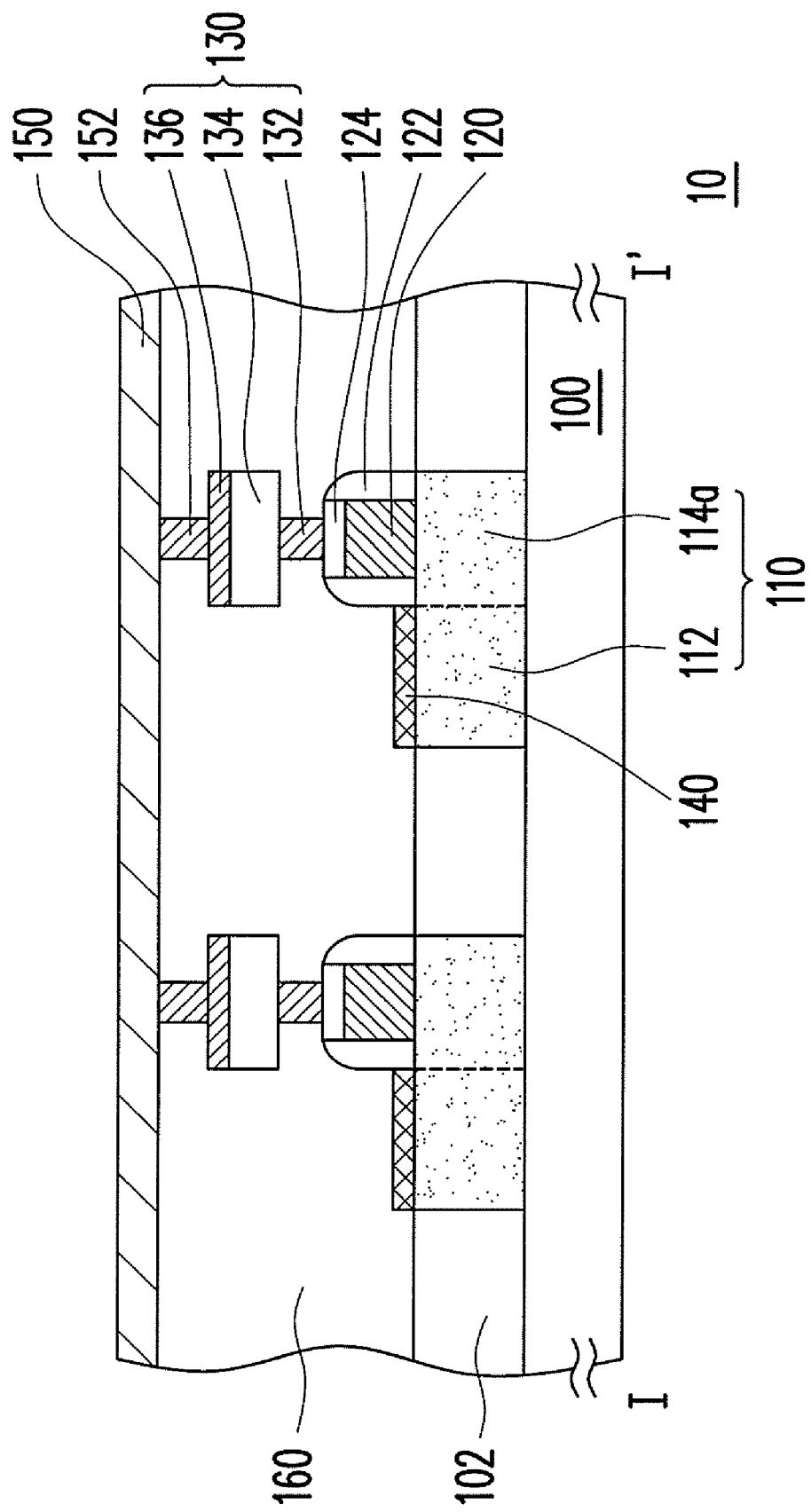
FIG. 1B is a schematic cross-sectional view of FIG. 1A, taken along a line I-I'.

FIG. 1A is a schematic top view of a phase change memory (PCM) according to an embodiment of the present invention. FIG. 1B is a schematic cross-sectional view of FIG. 1A, taken along a line I-I'. It should be particularly noted that, in order to show clearly in the drawings, only word lines 110, first metal silicide layers 140, and bit lines 150 are shown in FIG. 1A, whereas doped semiconductor layers 120, spacers 122, second metal silicide layers 124, memory cells 130, and plugs 152 which connect the word lines 110 to the bit lines 150 are omitted.

Referring to FIGS. 1A and 1B, the PCM 10 includes a semiconductor substrate 100, a plurality of buried word lines 110, a plurality of doped semiconductor layers 120, a plurality of memory cells 130, a plurality of first metal silicide layers 140, and a plurality of bit lines 150. In this embodiment, the PCM 10 further includes dielectric layers 160, which include, for example, silicon oxide, silicon nitride, silicon carbide, silicon oxy-nitride, low K material, porous dielectric material, other appropriate dielectric materials or combinations thereof.

Figure 2:
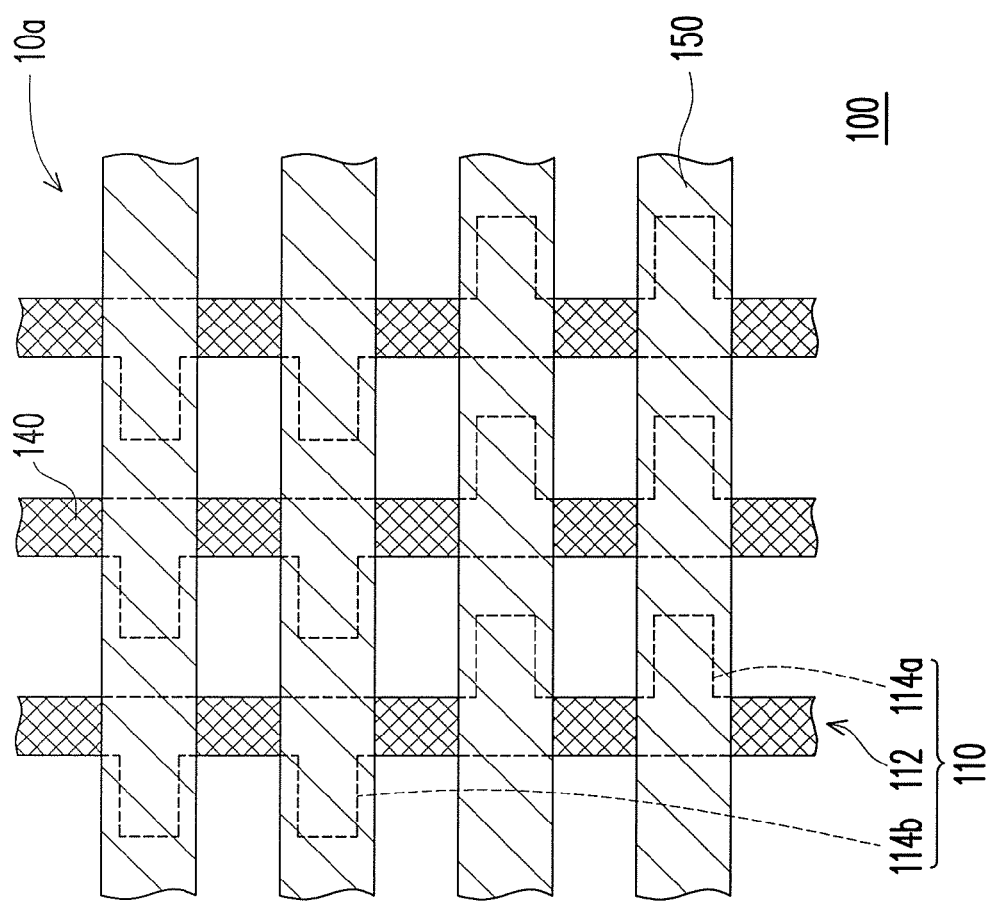
FIG. 2 is a schematic top view of a PCM according to another embodiment of the present invention.
Figure 3:
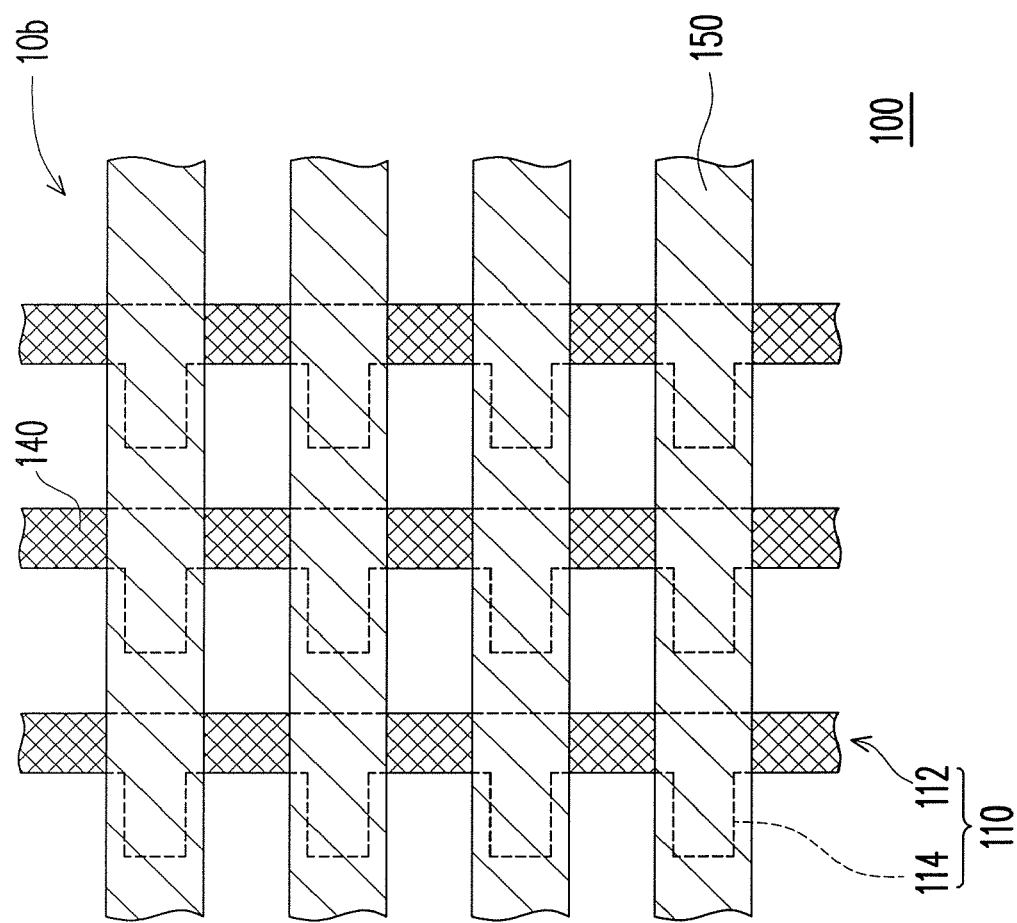
FIG. 3 is a schematic top view of a PCM according to still another embodiment of the present invention.
Figure 4:
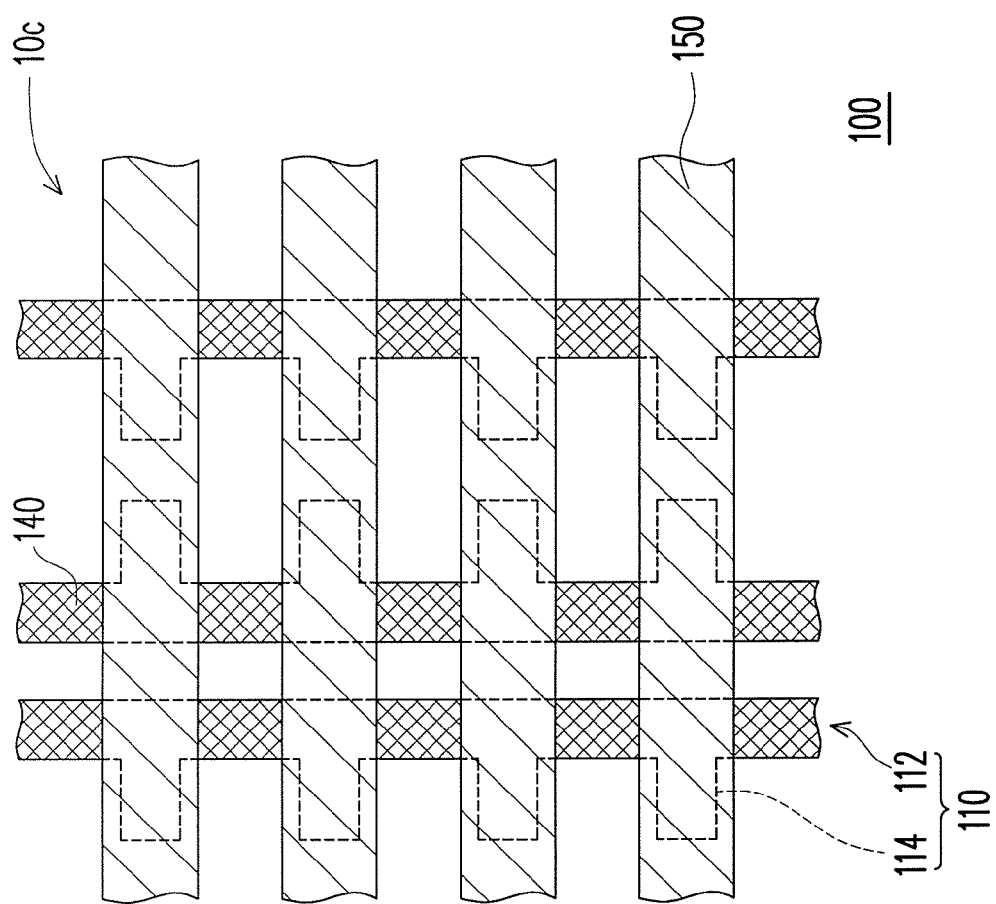
FIG. 4 is a schematic top view of a PCM according to yet another embodiment of the present invention.

In this embodiment, the semiconductor substrate 100 has a first conductive type and is, for example, a silicon substrate. The semiconductor substrate 100 includes isolation structures 102 and the buried word lines 110. The isolation structures 102 are disposed between the buried word lines 110, and include, for example, silicon oxide, silicon nitride, or another appropriate dielectric material. The buried word lines 110 are formed by the semiconductor substrate 100 that is ion-implanted or doped with a dopant of a second conductive type, so that the buried word lines 110 have the second conductive type. Each of the buried word lines 110 includes a line-shaped main portion 112 and a plurality of protrusion portions 114a and 114b. The line-shaped main portion 112 is extended along a first direction. The protrusion portions 114a and 114b are connected to one long side of the line-shaped main portion 112. In this embodiment, the protrusion portions 114a are, for example, located at one long side of the line-shaped main portion 112, and the protrusion portions 114b are, for example, located at the other long side of the line-shaped main portion 112. Moreover, the protrusion portions 114a and 114b are, for example, alternately arranged. Definitely, in other embodiments, as shown in FIGS. 2 to 4, the protrusion portions may be configured in other manners. It should be particularly noted that, in order to show clearly in the drawings, only the word lines 110, the first metal silicide layers 140, and the bit lines 150 are shown in FIGS. 2, 3, and 4, whereas the doped semiconductor layers 120, the spacers 122, the second metal silicide layers 124, the memory cells 130, and the plugs 152 disposed between the word lines 110 and the bit lines 150 are omitted. Referring to FIG. 2, in a PCM 10a, the protrusion portions 114a and 114b may be connected to the line-shaped main portion 112 in any manner, instead of being alternately arranged as shown in FIG. 1A. In addition, referring to FIGS. 3 and 4, in a PCM 10b and a PCM 10c, the protrusion portions 114 of one word line 110 may be located at the same long side of the line-shaped main portion 112. In other words, in the PCM of the present invention, the configuration of each word line may be the same or different from each other, that is to say, those skilled in the art should understand that, the number, size, and configuration manner of the protrusion portions of the word line may be adjusted depending upon the actual design requirements.

Referring to FIGS. 1A and 1B, the doped semiconductor layers 120 are disposed on the protrusion portions 114a and 114b. The doped semiconductor layers 120 have the first conductive type and include, for example, polysilicon, single crystal silicon, or epitaxial silicon that is ion-implanted or doped with a dopant. In this embodiment, the PCM 10 further includes a plurality of spacers 122. Each of the spacers 122 is disposed on a side wall of the doped semiconductor layer 120, so as to electrically insulate the doped semiconductor layer 120 from the first metal silicide layer 140. The spacers 122 include, for example, silicon oxide, silicon nitride, or another appropriate dielectric material. In addition, in this embodiment, the doped semiconductor layers 120 are further provided with the second metal silicide layers 124 thereon. The second metal silicide layers 124 include, for example, $TiSi_2$, $CoSi_2$, $WSi_2$, $NiSi_2$, or another appropriate metal silicide material.

In this embodiment, corresponding to the substrate 100 of a P type, the buried word lines 110 are of an N type and the doped semiconductor layers 120 are of the P type. Definitely, in another embodiment, corresponding to the substrate 100 of the N type, the buried word lines 110 are of the P type and the doped semiconductor layers 120 are of the N type. Therefore, the substrate 100, the buried word line 110 located in the substrate 100, and the doped semiconductor layer 120 located on the buried word line 110 jointly constitute a vertical bipolar junction transistor (BJT), which can enhance the device density, thereby forming a high-density memory.

Referring to FIGS. 1A and 1B, the memory cells 130 are disposed on and electrically connected to the doped semiconductor layers 120. Each of the memory cells 130 includes a first electrode 132, a phase change material layer 134, and a second electrode 136. The first electrode 132 includes a material which doesn't react with the phase change material layer 134, for example, tungsten, titanium nitride, aluminium titanium nitride, other metal or metal nitride, or other appropriate conductive material. The first electrode 132 herein is used as a heater of the phase change material layer 134, but a size or a shape of the first electrode 132 is varied in other embodiments (not shown). In addition, a heater made of a conductive material may be disposed between the first electrode 132 and the phase change material layer 134. Further, a heating rate of the heater is effected by a contact area between the heater and the phase change material layer 134, thus spacers may be disposed on the heater or around the heater to decrease the contact area between the heater and the phase change material layer 134(not shown). The phase change material layer 134 includes, for example, chalcogenide. The chalcogenide may be a binary material layer, a ternary material layer, or a multi-element material layer. A material of the binary material layer is, for example, InSb, GaSb, InSe, $Sb_2Te_3$, or GeTe. A material of the ternary material layer is, for example, $Ge_2Sb_2Te_5$, InSbTe, GaSbTe, $SnSbTe_4$, or InSbGe. A material of the multi-element material layer is, for example, AgInSbTe, (Ge, Sn)SbTe, GeSb(SeTe), or $Te_{81}Ge_{15}Sb_2S_2$. The second electrode 136 includes a material which doesn't react with the phase change material layer 134, for example, titanium nitride, aluminium titanium nitride metal, metal nitride, or another appropriate conductive material. It should be noted that, the memory cell structure in this embodiment is merely one selected from various kinds of phase change memory cells, which is mainly used to illustrate the PCM of the present invention in detail to enable those skilled in the art to implement the present invention accordingly, but not intended to limit the scope of the present invention. In other words, the memory cell may be any phase change memory cell known to those of ordinary skill in the art. Further, the PCM according to the present invention may be incorporated into the fabricating process of logic devices such as resistance, a capacitor and a transistor, etc. Thus, in order to heat the phase change material layer 134, other material layers not shown in the figures may be disposed on one or both of a top side and a bottom side of the first electrode 132 and a second electrode.

In this embodiment, the first metal silicide layers 140 are disposed on the line-shaped main portions 112. In other words, each of the buried word lines 110 is covered by the first metal silicide layer 140, except for the portion where the doped semiconductor layers 120 and the spacers 122 are disposed. That is, the first metal silicide layer 140 is continuously formed on each of the line-shaped main portion 112 of the buried word lines 110. In this way, when a current flows from one memory cell 130 to a signal contact (not shown), a transmission path thereof may be the continuous first metal silicide layer 140. Therefore, an impedance difference of the transmission paths between each of the memory cells 130 on the same word line 110 and the signal contact is rather small, so as to reduce a current difference and a voltage difference between the memory cells 130. The first metal silicide layer 140 includes, for example, $TiSi_2$, $CoSi_2$, $WSi_2$, $NiSi_2$, or another appropriate metal silicide material. In addition, in an alternative embodiment, the first metal silicide layers may be disposed on the line-shaped main portions and the protrusion portions depending upon a configuration manner of the doped semiconductor layers.

The plurality of bit lines 150 is disposed on a plurality of the memory cells 130, so as to connect to the memory cells 130 in in a second direction substantially perpendicular to the first direction. In this embodiment, the bit lines 150 are, for example, connected to the memory cells 130 through the plugs 152. In this embodiment, the bit lines include, for example, polysilicon, metal, metallide, or another appropriate conductive material, and the plugs 152 include, for example, copper, tungsten, metal nitride, or a combination thereof.

In view of the above, in the PCM according to the present invention, the buried word line includes the line-shaped main portion and the plurality of protrusion portions connected to the line-shaped main portion, the memory cells are disposed on the protrusion portions, and the metal silicide layers is disposed on the line-shaped main portion. That is to say, the continuous metal silicide layer is connected to each of the memory cells on the same word line. In this way, the impedance difference of the transmission paths between each of the memory cells on the same word line and the signal contact is rather small, so as to reduce the voltage difference between the memory cells.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A phase change memory (PCM), comprising:
   a semiconductor substrate, having a first conductive type;
   a plurality of buried word lines, having a second conductive type and disposed in the semiconductor substrate, wherein each of the buried word lines further comprises:
   a line-shaped main portion, extended along a first direction; and
   a plurality of protrusion portions, each protruded from one long side of the line-shaped main portion as viewed from the top view;
   a plurality of doped semiconductor layers, having the first conductive type and disposed on the protrusion portions respectively;
   a plurality of memory cells, wherein each of the memory cells comprises a phase change material layer and is disposed on and electrically connected to one of the doped semiconductor layers;
   a plurality of first metal silicide layers, disposed on the line-shaped main portions respectively; and
   a plurality of bit lines, each connected to memory cells disposed on the buried word lines in a second direction substantially perpendicular to the first direction.

2. The PCM according to claim 1, wherein the protrusion portions are located at the same long side of the line-shaped main portion.

3. The PCM according to claim 1, wherein the protrusion portions comprise a plurality of first protrusion portions and a plurality of second protrusion portions, the first protrusion portions are located at one long side of the line-shaped main portion, and the second protrusion portions are located at the other long side of the line-shaped main portion.

4. The PCM according to claim 1, wherein the first conductive type is an N type, and the second conductive type is a P type.

5. The PCM according to claim 1, wherein the first conductive type is a P type, and the second conductive type is an N type.

6. The PCM according to claim 1, wherein the phase change material layer comprises chalcogenide.

7. The PCM according to claim 1, further comprising a plurality of spacers, wherein each of the spacers is disposed on a side wall of one of the doped semiconductor layers.

8. The PCM according to claim 7, wherein each of the spacers comprises silicon oxide or silicon nitride.

9. The PCM according to claim 1, further comprising a plurality of second metal silicide layers, wherein each of the second metal silicide layers is disposed between the doped semiconductor layer and the memory cell.

10. The PCM according to claim 1, wherein each of the memory cells further comprises a first electrode disposed between the doped semiconductor layer and the phase change material layer.

11. The PCM according to claim 10, wherein the first electrode comprises metal or metal nitride.

12. The PCM according to claim 10, wherein each of the memory cells further comprises a second electrode disposed between the phase change material layer and the bit line.

13. The PCM according to claim 12, wherein the second electrode comprises metal or metal nitride.

14. The PCM according to claim 1, wherein the doped semiconductor layer comprises doped polysilicon, doped single crystal silicon or doped epitaxial silicon.

15. The PCM according to claim 1, wherein each of the protrusion portions is protruded from one long side of the line-shaped main portion in a direction parallel to the bit lines as viewed from the top view.

16. The PCM according to claim 1, wherein the line-shaped main portion is of the same material as the protrusion portions.

17. The PCM according to claim 1, wherein the first metal silicide layers directly contact the line-shaped main portions respectively.

18. A phase change memory (PCM), comprising:
a semiconductor substrate, having a first conductive type;
a plurality of buried word lines, having a second conductive type and disposed in the semiconductor substrate, wherein each of the buried word lines further comprises:
a line-shaped main portion, extended along a first direction; and
a plurality of protrusion portions, each protruded from one long side of the line-shaped main portion, wherein the line-shaped main portion is of the same material as the protrusion portions;
a plurality of doped semiconductor layers, having the first conductive type and disposed on the protrusion portions respectively;
a plurality of memory cells, wherein each of the memory cells comprises a phase change material layer and is disposed on and electrically connected to one of the doped semiconductor layers;
a plurality of first metal silicide layers, disposed on the line-shaped main portions respectively; and
a plurality of bit lines, each connected to memory cells disposed on the buried word lines in a second direction substantially perpendicular to the first direction.

19. The PCM according to claim 18, wherein the first metal silicide layers directly contact the line-shaped main portions respectively.

20. A phase change memory (PCM), comprising:
a semiconductor substrate, having a first conductive type;
a plurality of buried word lines, having a second conductive type and disposed in the semiconductor substrate, wherein each of the buried word lines further comprises:
a line-shaped main portion, extended along a first direction; and
a plurality of protrusion portions, each protruded from one long side of the line-shaped main portion;
a plurality of doped semiconductor layers, having the first conductive type and disposed on the protrusion portions respectively;
a plurality of memory cells, wherein each of the memory cells comprises a phase change material layer and is disposed on and electrically connected to one of the doped semiconductor layers;
a plurality of first metal silicide layers, directly contacting the line-shaped main portions respectively; and
a plurality of bit lines, each connected to memory cells disposed on the buried word lines in a second direction substantially perpendicular to the first direction.

* * * * *